(12) United States Patent
Higuma et al.

(10) Patent No.: US 8,546,842 B2
(45) Date of Patent: Oct. 1, 2013

(54) LED CHIP ASSEMBLY, LED PACKAGE, AND MANUFACTURING METHOD OF LED PACKAGE

(75) Inventors: Satoshi Higuma, Omuta (JP); Hideki Hirotsuru, Omuta (JP); Shinya Narita, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 18 days.

(21) Appl. No.: 13/384,479

(22) PCT Filed: Jul. 16, 2010

(86) PCT No.: PCT/JP2010/062102
§ 371 (c)(1),
(2), (4) Date: Jan. 17, 2012

(87) PCT Pub. No.: WO2011/007874
PCT Pub. Date: Jan. 20, 2011

(65) Prior Publication Data
US 2012/0112236 A1    May 10, 2012

(30) Foreign Application Priority Data
Jul. 17, 2009 (JP) .................................. 2009-168957

(51) Int. Cl.
*H01L 33/00* (2010.01)
(52) U.S. Cl.
USPC .............. 257/99; 257/100; 438/125; 438/126
(58) Field of Classification Search
USPC ............................. 257/99, 100; 438/125, 126
See application file for complete search history.

(56) References Cited

U.S. PATENT DOCUMENTS

| | | | | |
|---|---|---|---|---|
| 6,846,765 | B2 * | 1/2005 | Imamura et al. | 501/97.2 |
| 7,031,166 | B2 * | 4/2006 | Imamura et al. | 361/750 |
| 7,256,483 | B2 * | 8/2007 | Epler et al. | 257/676 |
| 8,465,666 | B2 * | 6/2013 | Asahi et al. | 252/76 |
| 2002/0164475 | A1 * | 11/2002 | Imamura et al. | 428/325 |
| 2005/0094381 | A1 * | 5/2005 | Imamura et al. | 361/750 |

FOREIGN PATENT DOCUMENTS

| | | |
|---|---|---|
| JP | 05 032485 | 2/1993 |
| JP | 3468358 | 11/2003 |
| JP | 2006 128710 | 5/2006 |
| JP | 2007 042749 | 2/2007 |
| JP | 2007 165840 | 6/2007 |

(Continued)

OTHER PUBLICATIONS

International Search Report Issued Aug. 24, 2010 in PCT/JP10/062102 Filed Jul. 16, 2010.

*Primary Examiner* — Ngan Ngo
(74) *Attorney, Agent, or Firm* — Oblon, Spivak, McClelland, Maier & Neustadt, L.L.P.

(57) ABSTRACT

Provided is a highly reliable LED package with significantly improved heat radiating properties, manufacturing method of the LED package, and an LED chip assembly used in the LED package. The LED package is characterized in that the LED chip assembly (10) is bonded to a circuit board (11) created by forming metal circuitry (3) on a metal substrate (5) with an insulation layer (4) therebetween, whereas an LED chip (1) of the LED chip assembly and the metal circuitry (3) of the circuit board are connected via an electrical connection member (9), and at least the LED chip assembly and the electrical connection member are encapsulated with resin encapsulant (8) including fluorescent material.

18 Claims, 3 Drawing Sheets

(56) References Cited

FOREIGN PATENT DOCUMENTS

| JP | 2008 091831 | 4/2008 |
|----|-------------|--------|
| JP | 2008 544488 | 12/2008 |
| JP | 2009 123829 | 6/2009 |
| WO | 2008 018482 | 2/2008 |

* cited by examiner the present invention is an LED chip assembly, LED package and manufacturing method for an LED package.

LED CHIP ASSEMBLY, LED PACKAGE, AND MANUFACTURING METHOD OF LED PACKAGE

TECHNICAL FIELD

The present invention relates to an LED chip assembly, LED package and manufacturing method for an LED package.

BACKGROUND ART

LED light emitting devices are devices that emit light when a forward current is passed through a pn junction of a semiconductor, produced using a III-V semiconductor crystal such as GaAs or GaN. In recent years, advances in semiconductor epitaxial growth technologies and light-emitting device process technologies have led to development of LED light-emitting devices excelling in conversion efficiency, used widely in various fields.

LED chips are composed of a p-type and an n-type layer formed by epitaxial growth of a III-V semiconductor crystal on a growth substrate, and a photoactive layer sandwiched therebetween. In general, a III-V semiconductor crystal is epitaxially grown on a growth substrate such as monocrystalline sapphire, then electrodes or the like are formed to yield an LED chip.

Since the thermal conductivity of monocrystalline sapphire is about 40 W/(m·k), it cannot adequately dissipate the heat generated by the III-V semiconductor devices. In particular, with high-output LEDs taking high currents, the temperature of the device can rise, causing reduced light emission efficiency and reduced device lifetime. In order to solve this problem, a method of epitaxially growing a III-V semiconductor crystal on a growth substrate, then bonding to a package substrate (retaining substrate) through a metal layer, followed by removing the growth substrate has been proposed (Patent Document 1), but was not entirely satisfactory. In other words, metal package substrates (retaining substrates) are conductive, and therefore must have a non-insulated structure at the time of mounting. For example, when soldering to a mounting substrate such as a circuit board, an insulation layer of low thermal conductivity such as a resin or the like must be provided immediately under the bonded portion, but this insulation layer inhibits the satisfactory dissipation of heat.

On the other hand, in high-output LED light emitting devices in which problems due to heat generation by the LED chip must be reduced as much as possible, a method of mounting an LED chip to a circuit board or the like via a heat dissipating plate such as a copper (Cu) plate has been proposed (Patent Document 2). However, the coefficient of linear thermal expansion of Cu is about $17 \times 10^{-6}$/K, which differs largely from the about $5 \times 10^{-6}$/K of LED chips, so cracks can appear in the bonded portion during use, thereby lowering the heat dissipating ability.

Patent Document 1: JP-A 2006-128710
Patent Document 2: JP-T 2008-544488

SUMMARY OF THE INVENTION

In view of the above considerations, the purpose of the present invention is to offer a highly reliable LED package with greatly improved heat dissipating ability, a manufacturing method for an LED package, and an LED chip assembly used for this LED package.

The present invention is an LED chip assembly (10) formed by directly mounting one or more LED chips (1) onto a composite substrate (2) by means of a bonding material (not shown), wherein said composite substrate is formed by infiltration of an inorganic formed body with aluminum, silicon or an alloy containing said components, has a thickness of 0.1 to 2 mm, a surface roughness (Ra) of 0.5 microns or less, a thermal conductivity of 100 to 600 W/(m·k) at a temperature of 25° C., a coefficient of thermal expansion of 3 to $12 \times 10^{-6}$/K at temperatures of 25° C. to 150° C., and a three-point bending strength of 50 to 500 MPa, and the area of the LED chip-mounting surface of the composite substrate is 2 to 100 times the area of contact with the LED chip.

Additionally, the present invention is an LED chip assembly (10) formed by directly mounting one or more LED chips (1) onto a composite substrate (2) by means of a bonding material (not shown), wherein said composite substrate is formed by infiltration of an inorganic formed body having a porosity of 10 to 40 vol % with an aluminum-silicon alloy having an aluminum content of 80 to 97 mass %, has a thickness of 0.1 to 1 mm, a surface roughness (Ra) of 0.05 to 0.5 microns, a thermal conductivity of 100 to 300 W/(m·k) at a temperature of 25° C., a coefficient of thermal expansion of 4 to $9 \times 10^{-6}$/K at temperatures of 25° C. to 150° C., and a three-point bending strength of 50 to 400 MPa, and the area of the LED chip-mounting surface of the composite substrate is 2 to 25 times the area of contact with the LED chip.

The LED chip assembly of the present invention preferably has at least one embodiment chosen from among those wherein (a) the composite substrate has, on its surface, a metal layer composed of at least one metal chosen from among Ni, Co, Pd, Cu, Ag, Au, Pt and Sn, with a thickness of 0.5 to 20 microns; (b) the bond by the bonding material is by soldering, brazing or adhesion by a high thermal conductivity adhesive; (c) the material of the inorganic formed body is at least one material chosen from among silicon carbide, aluminum nitride, silicon nitride, diamond and graphite; and (d) the LED chip is a non-insulated structure with an output of at least 0.5 W.

Additionally, the present invention is an LED package wherein the LED chip assembly (10) in accordance with any one of claims 1 to 6 is bonded to a circuit board (11) having a metal circuit (3) formed on a metal substrate (5) with an insulation layer (4) in between, an LED chip (1) of the LED chip assembly is connected to the metal circuit (3) of the circuit board by an electrical connection member (9), and at least the LED chip assembly and the electrical connection member are sealed by a resin encapsulant (8) containing a fluorescent substance.

The LED package of the present invention preferably has one or both of the embodiments wherein (e) the fluorescent substance is at least one substance chosen from among alpha-sialon, beta-sialon, CASIN (Ca.Al.Si.N$_3$), yttrium-aluminum-garnet and sulfides, and the resin encapsulant contains a filler other than the fluorescent substance, having a relative refractive index of at least 2.2, and an average grain size of 1 to 100 nm; and (f) the insulation layer (4) has a thermal conductivity of 0.5 to 20 W/(m·K) and a thickness of 0.03 to 0.2 mm, and the material of the metal circuit (3) is aluminum or copper and its thickness is 0.005 to 0.4 mm.

Additionally, the present invention is a method of manufacturing the LED package in accordance with claim 7, comprising the following steps:
(i) producing an inorganic formed body composed of a sintered compact or a powder compact having a porosity of 10 to 50 vol % using at least one material chosen from among silicon carbide, aluminum nitride, silicon nitride, diamond and graphite;

(ii) producing a composite by impregnating the inorganic formed body with aluminum or an aluminum alloy by liquid forging at a pressure of at least 30 MPa, or impregnating with silicon or a silicon alloy by liquid infiltration;

(iii) machining the composite to produce a pre-composite substrate having a thickness of 0.1 to 2 mm, a surface roughness (Ra) of 0.5 microns or less, a thermal conductivity of 100 to 600 W/(m·K) at a temperature of 25° C., a coefficient of thermal expansion of 3 to $12 \times 10^{0-6}$/K at temperatures of 25° C. to 150° C., and a three-point bending strength of 50 to 400 MPa;

(iv) producing a composite substrate (2) by forming a metal layer composed of at least one metal chosen from among Ni, Co, Pd, Cu, Ag, Au, Pt and Sn on the pre-composite substrate as needed, then cutting to an area of 2 to 100 times the contact area of the LED chip to be mounted, and subsequently producing an LED chip assembly (10) by mounting one or more LED chips (1) by means of a bonding material;

(v) bonding the LED chip assembly (10) to the circuit board (11) having the metal circuit (3) formed on the metal substrate (5) with the insulation layer (4) in between; and (vi) connecting the LED chip (1) of the LED chip assembly to the metal circuit (3) of the circuit board by means of an electrical connection member (9), then sealing at least the LED chip assembly and the electrical connection member with a resin encapsulant (8) containing a fluorescent substance.

The present invention offers an LED package with greatly improved heat dissipating ability and high reliability, a manufacturing method for the LED package and an LED chip assembly used in the LED package. The LED package of the present invention is formed using an LED chip assembly having an LED chip directly mounted on a composite substrate, allowing the illumination temperature of the LED chip to be reduced, and achieving higher luminance of the LED.

Figure 1:
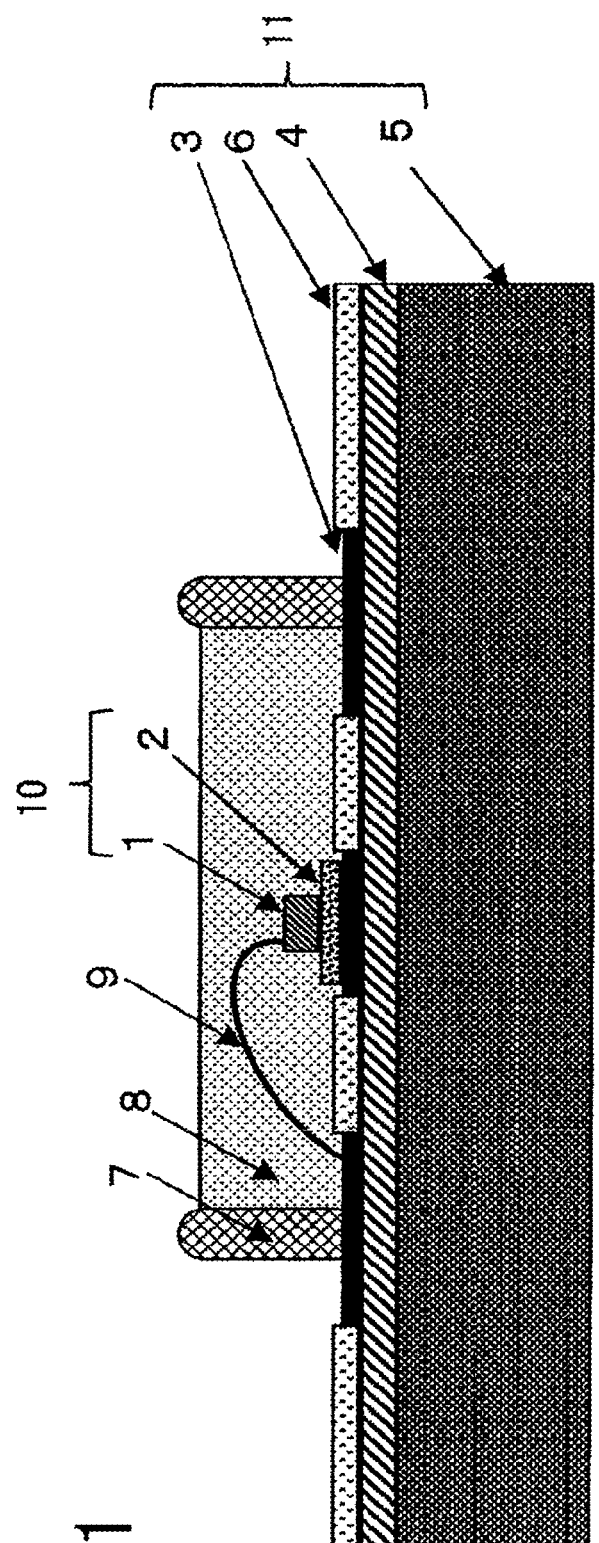
[FIG. 1] A diagram for explaining an example of an LED package according to the present invention.

| DESCRIPTION OF REFERENCE NUMBERS | |
|---|---|
| 1 | LED chip |
| 2 | composite substrate |
| 3 | metal circuit |
| 4 | insulation layer |
| 5 | metal substrate |
| 6 | resist layer |
| 7 | dam material |
| 8 | resin encapsulant |
| 9 | electrical connection member |
| 10 | LED chip assembly |
| 11 | circuit board |

MODES FOR CARRYING OUT THE INVENTION

<LED Chip Assembly>

The structure of the LED chip assembly of the present invention comprises an LED chip directly mounted on a composite substrate using a bonding material, the area of the LED chip mounting surface of the composite substrate being 2-100 times, preferably 2-25 times the are of contact with the LED chip. If this area ratio (factor) is less than 2 times, then the heat from the LED chip cannot be sufficiently spread to the composite substrate, and the temperature during illumination of the LED chip becomes high. On the other hand, if the area ratio (factor) exceeds 100, then there is a risk of the electrical bonding member (e.g., Au wire bonding) for passing electricity to the LED chip becoming excessively long, thereby reducing reliability.

For the purposes of the present specification, "LED chip" shall refer to a structure consisting of an LED device composed of a III-V semiconductor crystal and a supporting substrate. The LED device is a III-V semiconductor crystal emitting light in the UV to blue wavelength range, specifically InGaN, AlGaAs, AlGaInP or the like. The supporting substrate is a growth substrate used for epitaxial growth of the III-V semiconductor crystal or a high thermal conductivity substrate formed by performing epitaxial growth of a III-V semiconductor crystal on a growth substrate, bonding a high thermal conductivity substrate by means of a metal layer, and subsequently removing the growth substrate. Examples include sapphire, silicon carbide, silicon, Cu/W and Cu/Mo. Of these, with LED chips requiring outputs of 0.5 W or more, the latter type of supporting substrate is used for their thermal conductivity properties, and the LED chip has a non-insulated structure. The advantage of a non-insulated LED chip is the ability to obtain high luminance in a small area.

LED chips are directly mounted on composite substrates using a bonding material. The bond may be achieved, for example, by soldering, brazing, or using a high thermal conductivity adhesive, of which soldering and brazing are preferred. The solder may be a cream solder, a eutectic solder, or a lead-free solder. The brazing is preferably a brazing method using a eutectic metal layer on the reverse surface of the LED chip, whereby the layer formed by the bonding material, in other words, the bonding layer, can be made as thin as 1 to 5 microns. The expression "high thermal conductivity adhesive" refers to an adhesive with a thermal conductivity of at least 10 W/(m·K), examples of which include Ag paste, high thermal conductivity silicone adhesives and Ag-containing conductive adhesives. For the purposes of the present specification, "bonding" shall refer to attachment between the LED chip and the composite substrate, and is used synonymously with "mounting".

The thickness of the bonding layer is preferably 0.1 mm or less, and preferably 0.05 mm or less. If the thickness of the bonding layer exceeds 0.1 mm, the thermal resistance becomes high. While the adhesion rate, i.e. the ratio between the bottom surface area of the LED chip and the area of the bonding layer, should be as close as possible to 1, the heat generated by the LED chip can be transmitted to the composite substrate without any problems as long as it is at least 0.5, preferably at least 0.8. If the surface roughness (Ra) of the composite substrate exceeds 0.5 microns, there is a risk of problems such as reduced adhesion rate. While the surface roughness (Ra) should be as small as possible, the lower limit should preferably be 0.01 microns in order to keep down processing costs.

The expression "composite substrate" refers to a substrate produced by impregnating an inorganic formed body, preferably an inorganic formed body with a porosity of 10 to 50 vol %, more preferably with a porosity of 20 to 35 vol %, with aluminum, silicon or an alloy containing said components, preferably an aluminum-silicon alloy with an aluminum content of 80 to 97 mass %, by a liquid forging process, such as the method of JP 3468358 B, or with silicon or a silicon alloy by a liquid infiltration process, such as the method of JP H5-32485 A, having a thickness of 0.1 to 2 mm, preferably 0.1 to 1 mm, a surface roughness (Ra) of 0.5 microns or less, preferably 0.05 to 0.5 microns, a thermal conductivity at a temperature of 25° C. of 100 to 600 W/(m·K), preferably 100 to 300 W/(m·K), a coefficient of thermal expansion from temperatures of 25° C. to 150° C. of 3 to $12 \times 10^{-6}$/K, preferably 4 to $9 \times 10^{-6}$/K, and a three-point bending strength of 50 to 500 MPa, preferably 50 to 400 MPa.

The material of the inorganic formed body is preferably at least one chosen from among silicon carbide, aluminum carbide, silicon nitride, diamond and graphite. The proportion of voids (porosity) in the inorganic formed body is preferably 10 to 50 vol %, more preferably 20 to 35 vol %. When the porosity exceeds 50 vol %, the coefficient of linear thermal expansion of the composite substrate becomes too high, whereas at less than 10 vol %, the aluminum, silicon or alloy containing said components cannot be adequately impregnated, so the thermal conductivity may be too low. The porosity can be adjusted by adjusting the granularity, molding pressure and sintering conditions of the inorganic components such as silicon carbide, aluminum nitride, silicon nitride, diamond and graphite.

Since the composite substrate used in the present invention has the function of a heat spreader for spreading the heat generated in the LED chip in the planar direction, a highly reliable LED package can be produced for use with high-output LEDs. The thermal conductivity of the composite substrate at a temperature of 25° C. is 100 to 600 W/(m·K). If the thermal conductivity is less than 100 W/(m·K), the heat generated by the LED chip cannot be adequately dissipated, and particularly in the case of high-output LEDs, the device temperature may rise and the emission efficiency may fall, accompanied by a reduced device lifetime. While there are no restrictions on the upper limit of the thermal conductivity in terms of the physical properties, an upper limit of 600 W/(m·K) is suggested due to the increased expense to the composite substrate. The thermal conductivity can be raised and lowered according to the type and amounts of raw materials in the inorganic formed body.

The difference in coefficient of thermal expansion between the III-V semiconductor crystal and the supporting substrate forming the LED chip is preferably small. Additionally, since the composite substrate to which the LED chip is bonded is itself bonded to a metal circuit of a circuit board, the composite substrate should preferably have the function of alleviating stress caused by the difference in coefficient of thermal expansion between the LED chip and the circuit board. For this reason, the coefficient of linear thermal expansion of the composite substrate at temperatures of 25° C. to 150° C. is 3 to $12 \times 10^{-6}$/K. If the coefficient of thermal expansion is otherwise, then the difference in coefficient of linear thermal expansion with respect to the LED chip may result in warping after mounting, separation of the mounted portion, and in the worst case, cracking of the LED chip. The coefficient of linear thermal expansion of the composite substrate may be increased or decreased depending on the constitution ratio between the aluminum, silicon or alloy containing said components and the inorganic formed body.

Other properties required of the composite substrate are (a) having sufficient strength to withstand the mounting of the LED chip by a bonding material, and (b) the bonding surface being flat, without any voids or intervening matter such as contaminants on the bonding surface. In order to satisfy (a), the three-point bending strength of the composite substrate is set to at least 50 MPa. In order to produce a composite substrate exceeding 500 MPa, the inorganic formed body must be a fine sintered compact, making it difficult to form composites with aluminum, silicon or alloys containing said components, so the upper limit is preferably 500 MPa. In order to satisfy (b), the surface roughness (Ra) of the composite substrate should be 0.5 microns or less. The three-point bending strength may be increased or decreased according to the material of the inorganic formed body, the grain size of the inorganic components and the porosity, and the surface roughness (Ra) may be increased or decreased according to the granularity of the abrasive grains of the grindstone used for processing.

In order to provide good heat dissipation of the LED chip assembly and improve the handling of the LED chip when mounting, the thickness of the composite substrate should be 0.1 to 2 mm, preferably 0.1 to 1 mm.

The composite substrate preferably has a metal layer of thickness 0.5 to 20 microns, composed of at least one type of metal chosen from among Ni, Co, Pd, Cu, Ag, Au, Pt and Sn, preferably Ni or Au, on the surface. The metal layer preferably has a thickness of 2 to 20 microns. As a result, the adhesion rate is improved. If the metal layer is less than 0.5 microns thick, the adhesion rate improvement effect is small, and if it exceeds 20 microns, the difference in thermal expansion between the metal layer and the heat spreader can result in separation.

The metal layer may be formed by cleaning the composite substrate, then non-electrolytically plating or electroplating with the above metal species. Aside from plating methods, metal vapor deposition or metal coating may be used.

<LED Package>

Figure 2:
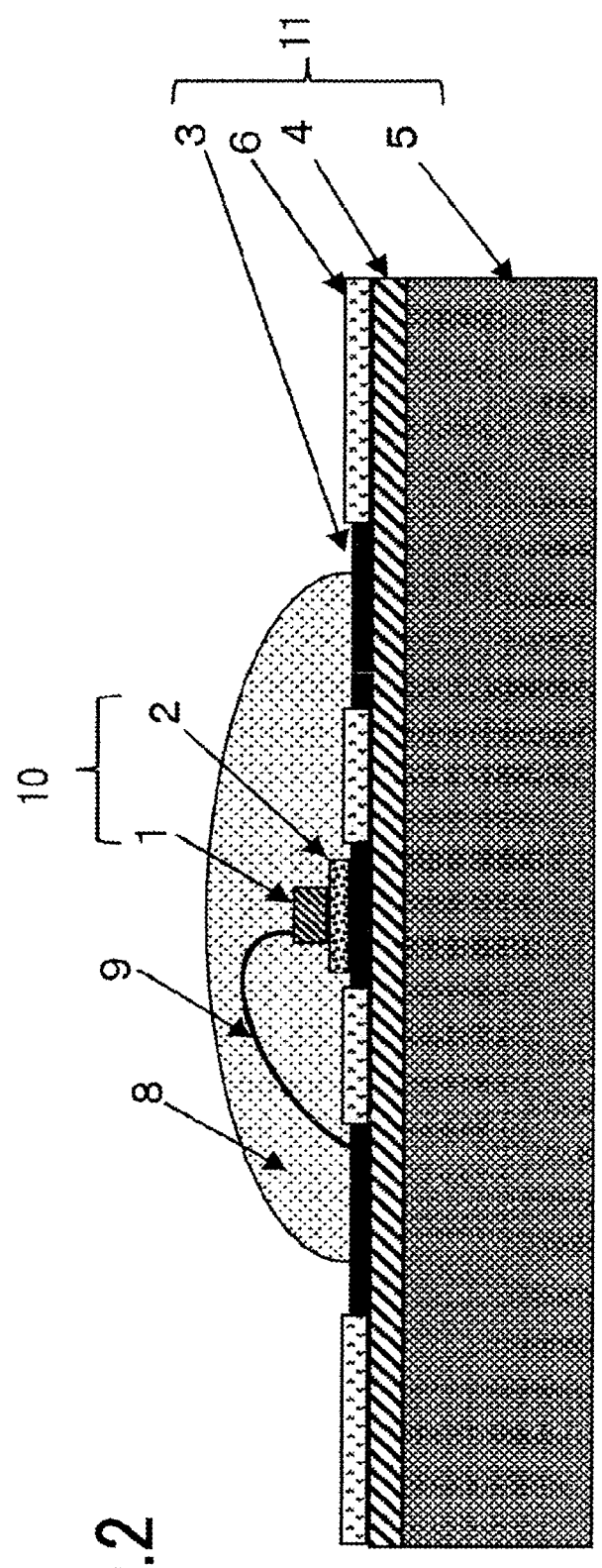
[FIG. 2] A diagram for explaining another example of an LED package according to the present invention.
Figure 3:
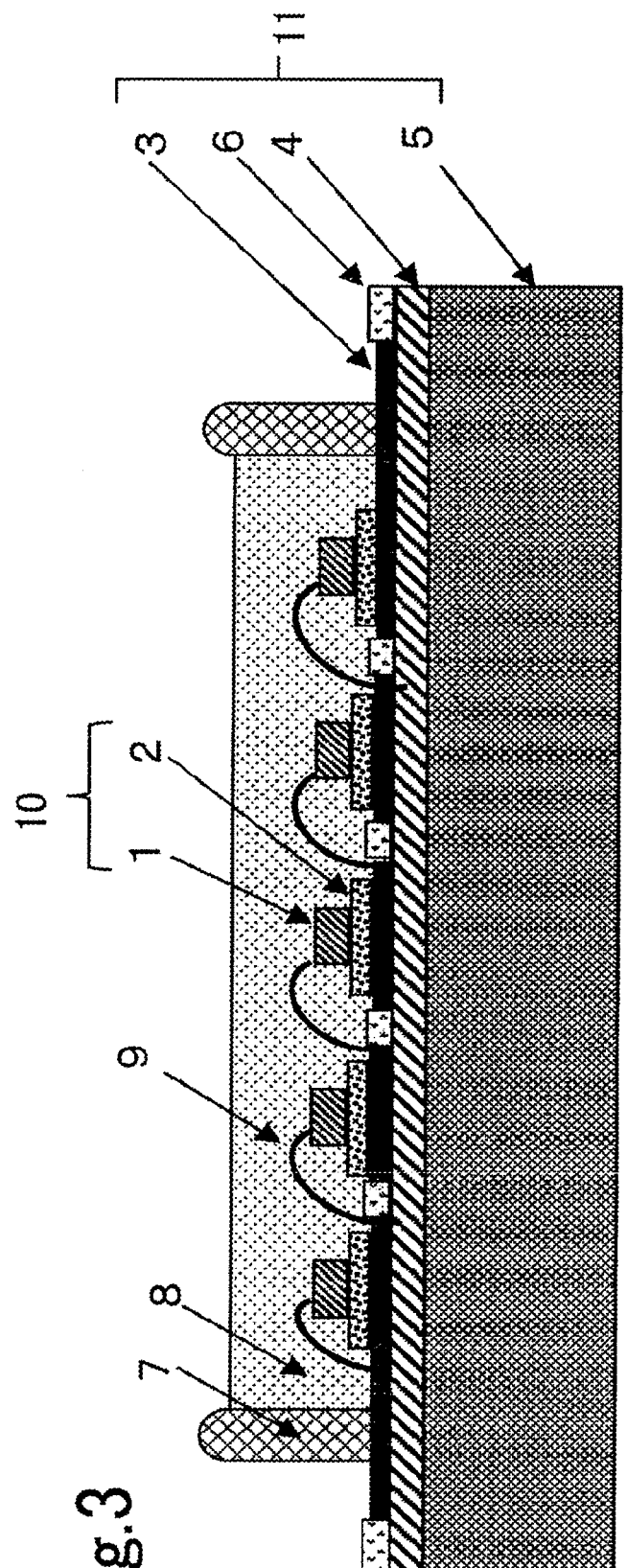
[FIG. 3] A diagram for explaining yet another example of an LED package according to the present invention.

FIGS. 1-3 are explanatory diagrams showing examples of LED packages. The LED package of the present invention has a basic structure wherein the LED chip assembly 10 of the present invention is mounted on a circuit board 11, connected by an electrical connection member 9, and sealed by a resin encapsulant 8 (FIGS. 1-3). FIGS. 1 and 2 show embodiments using a single LED chip assembly, and FIG. 3 shows an embodiment using two or more LED chip assemblies. FIGS. 1 and 3 show embodiments using a dam material 7, and FIG. 2 shows an embodiment not using such a material. The embodiments shall be described in detail below.

<LED Package—Circuit Board>

The LED package of the present invention has the LED chip assembly 10 of the present invention mounted on a circuit board 11. The circuit board 11 is composed of a layered structure of a metal circuit 3 and a metal substrate 5 with an insulation layer 4 in between. The metal circuit 3 and the metal substrate 5 are preferably composed of aluminum, iron, copper or an alloy having such metals as components. The surface of the metal circuit on which the LED chip assembly is mounted should be subjected to a surface treatment in order to improve the bonding ability and prevent oxidation of the surface, the surface of the metal circuit bonded to the insulation layer should be subjected to a surface treatment in order to improve the adhesion to the insulation layer, and furthermore, the surface of the metal substrate adhered to the insulation layer should be subjected to a surface treatment in order to improve the closeness of contact with the insulation layer, the surface treatments being respectively sandblasting, etching, various types of plating and coupler treatments.

The thickness of the metal circuit is preferably 0.005 to 0.4 mm. At less than 0.005 mm, an adequate conduction circuit cannot be obtained for use as an LED package, and at more than 0.40 mm, there are many restrictions on circuit formation. The metal substrate is preferably 0.1 to 4 mm thick. If too thin, it becomes difficult to handle, and even if made any thicker, there are no practical advantages as an LED package for illumination purposes.

The insulation layer 4 is a cured material formed of a curable resin composition containing a heat-resistant resin, a curing agent and an inorganic filler, the thermal conductivity of which is preferably at least 0.5 W/(m·K). If the thermal conductivity is less than 0.5 W/(m·K), the heat generated by the LED chip cannot be sufficiently spread, the junction temperature of the LED chips becomes too high, and there is a risk of reduced luminance and reduced lifetime of the LED chips. It is sufficient for the upper limit of the thermal conductivity to be 20 W/(m·K). The thickness of the insulation layer should preferably be 30 to 200 microns. If less than 30 microns, the electrical insulating ability is inadequate, and if in excess of 200 microns, the heat dissipating ability may be lost.

Examples of heat-resistant resins that may be used include epoxy resins, silicone resins, phenol resins and imide resins. Examples of curing agents shall be described below. Examples of inorganic fillers include ceramic oxides such as aluminum oxide (alumina), silicon oxide and magnesium oxide, ceramic nitrides such as aluminum nitride, silicon nitride and boron nitride, and ceramic carbides. The inorganic fillers are preferably spherical powders with a maximum grain size of 100 microns or less and a minimum grain size of at least 0.05 microns. Of these, it is preferably to use those comprising 50 to 75 mass % of grains with a grain size of 5 to 50 microns and 25 to 50 mass % of grains with a grain size of 0.2 to 1.5 microns.

The proportional content of the inorganic filler in the insulation layer is preferably 70 to 95 parts by mass, more preferably 80 to 90 parts by mass with respect to 100 parts by mass of the total weight of the heat-resistant resin and the curing agent. If the proportion of inorganic filler with respect to 100 parts by weight of the total weight of the heat-resistant resin and curing agent exceeds 95 parts by weight of inorganic filler, the viscosity of the curable resin composition will rise, thereby reducing productivity. On the other hand, at less than 70 parts by mass, there is a risk of a decrease in the thermal conductivity of the insulation layer. The curable resin composition for forming an insulation layer may, if necessary, make use of a silane coupler, a titanate coupler, a stabilizer or a curing promoter.

Furthermore, a preferred insulation layer shall be explained. When the difference in coefficient of thermal expansion between the LED chip assembly and the circuit board is large, the storage elasticity of the insulation layer is preferably 15000 MPa or less at 300 K in order to relieve the stress at the bonding portion generated thereby. Such an insulation layer can be achieved by preparing a curable resin composition containing 5 to 50 parts by mass of a curing agent having a polyether backbone with a primary amino group at the terminus of the main chain, and 70 to 95 parts by mass of the aforementioned inorganic filler per 100 parts by mass of the epoxy resin.

While the epoxy resin may be a general-purpose epoxy resin such as a bisphenol F epoxy resin or bisphenol A epoxy resin, the balance between stress relief and moisture resistance can be further improved by including at least 10 mass % of at least one type chosen from among epoxy resins having a dicyclopentadiene backbone, epoxy resins having a naphthalene backbone, epoxy resins having a biphenyl backbone and epoxy resins having a novolac backbone in the epoxy resin. While typical epoxy resins having a novolac backbone include phenol novolac epoxy resins and cresol novolac epoxy resins, epoxy resins having a dicyclopentadiene backbone, a naphthalene backbone or having both a biphenyl backbone and a novolac backbone may also be used. As the epoxy resin, an epoxy resin having a backbone as indicated above may be used alone. Additionally, as other resins mainly composed of epoxy resins, a thermocurable resin such as a phenol resin or polyimide resin, or a high molecular weight resin such as an acrylic rubber or acrylonitrile-butadiene may be added, and when considering the balance between stress relief, electrical insulation, heat resistance and moisture resistance, the amount of the high molecular weight resin should preferably be 30 mass % or less with respect to the total amount of the epoxy resin.

As the curing agent, a curing agent having a polyether backbone and having a primary amino group on the terminus of the main chain is used to lower the storage elasticity of the resin composition after curing. It can also be used in combination with another curing agent. When used together with an aromatic amine curing agent, the balance of stress relief, electrical insulation and moisture resistance can be further improved. Examples of aromatic amine curing agents include diaminophenylmethane, diaminodiphenylsulfone and meta-phenylenediamine. A curing agent such as a phenol novolac resin may also be used.

A metal circuit 3 may be bonded to the metal substrate 5 with the insulation layer 4 in between, to form a circuit board 11, for example, as follows. In other words, it is possible to use a method of pattern-printing a curable resin composition slurry for forming an insulation layer onto a metal substrate 5 (e.g. an aluminum substrate) by means of a method such as screen printing, heating to a semi-cured state, then laying a metal foil (such as a copper foil) for forming a metal circuit 3 and further heating to result in an almost completely cured state, or a method of processing an insulation layer into the form of a semi-cured sheet beforehand, then integrating with a metal foil (e.g. a copper foil) for forming a metal circuit 3 by means of a hot press. The metal circuit patterning method may be one, for example, of applying the resist layer to predetermined locations on a metal foil and curing, then etching with an etchant such as a mixture of cupric chloride, hydrogen peroxide water and sulfuric acid.

<Connection Between LED Package—Circuit Board and LED Chip Assembly>

The LED package of the present invention has an LED chip 1 of an LED assembly and a metal circuit 3 of a circuit board connected by an electrical connection member 9. Examples of electrical connection members 9 include wire bonding, bumps and bridges using Ag, Au or the like. The LED chip assembly 10 is bonded to the metal circuit 3, and the bond is achieved by soldering, brazing or by using a high thermal conductivity adhesive. Soldering is preferred.

<LED Package—Resin Encapsulant>

The LED package of the present invention has at least the above-described LED chip assembly 10 and the above-described electrical connection member 9 sealed in a resin encapsulant 8 containing a fluorescent substance. A dam material 7 may be provided so as to surround the perimeter of the LED chip assembly in order to prevent the resin encapsulant from spreading during the resin encapsulation, as shown in FIGS. 1 and 3. The dam material may, for example, be a silicone resin or an epoxy resin, formed by screen printing, a dispenser or the like.

The resin of the resin encapsulant may be a thermocurable resin such as a silicone resin, an epoxy resin, a polydimethylsiloxane derivative having an epoxy group, an oxetane resin, an acrylic resin or a cyclo-olefin resin, of which silicone resins are preferred for their high refractive indices and heat resistance. The resin encapsulant may include a fluorescent substance, the content of which should preferably be 1 to 50 mass %.

There are no particular restrictions on the material of the fluorescent substance as long as it is capable of receiving light from the LED chip and emitting visible light. Examples include alpha-sialon, beta-sialon, CASIN (Ca.Al.Si.N$_3$), yttrium, aluminum, garnet and sulfides, of which at least one type may be used. Of these, alpha-sialon and beta-sialon are preferred.

The alpha-sialon need not be particularly special, and those that are normally available may be used. The oxygen content is preferably 1.2 mass % or less. Additionally, those having a cumulative grain size distribution, as measured by laser diffraction/scattering (e.g., using a CILAS Granulometer Model 920), such that the cumulative value for 50 vol % grain size (D50) is 5 to 20 microns and the cumulative value for 90 vol % grain size (D90) is 6 to 50 microns, are capable of providing higher luminance and are therefore preferred.

Additionally, the beta-sialon need not be particularly special, and those that are normally available may be used. Of these, those containing Eu and having a spin density of $2.0 \times 10^{17}$/g or less corresponding to absorption at $g=2.00\pm0.02$ at 25° C. in an electron spin resonance spectrum are preferred. Additionally, those wherein D50 is 6 to 30 microns, D10 is at least 4 microns and the BET specific surface area is 0.5 m$^2$/g or less are more preferred.

In order to improve the light extraction efficiency from the LED chips, the resin encapsulant preferably includes a filler with a relative refractive index of at least 2.2. Examples thereof include titanium oxide, zirconium oxide and potassium titanate. The average grain size of the filler should preferably be 100 nm or less. At more than 100 nm, the amount of light lost to scattering may increase.

<LED Package—Resist Layer>

The LED package of the present invention may be provided with a resist layer to enable the light from the LED chip to be more efficiently projected forward. In order to avoid inhibiting the generation of light from the LED chip, the resist layer should preferably not be provided on the light emitting portion of the LED chip and the electrical connection member. The reflectance of the resist layer should preferably be at least 70% for light of wavelengths 400 to 800 nm, more preferably with a maximum value of reflectance of at least 80%, even more preferably at least 85%, in the wavelength ranges of 450 to 470 nm, 520 to 570 nm and 620 to 660 nm.

The resist layer having the above properties may be produced by including a white pigment in a curable resin containing one or both of a UV curable resin and a thermocurable resin.

As curable resins, epoxy resins, acrylic resins and mixtures thereof may be suitably used. As the white pigment, at least one type chosen from among zinc oxide, calcium carbonate, titanium dioxide, alumina and smectite may be used. Of these, rutile type titanium dioxide is preferred for having weak photocatalytic action. The white pigment may be subjected to a surface treatment, for example, with a silicon dioxide or aluminum hydroxide to weaken the photocatalytic action. Regarding the content of the white pigment, if too low, the reflection effect is not sufficient, and if too high, the fluidity during film formation may decrease, so as not to be able to form a uniform film. Therefore, the content in the resist layer should preferably be 30 to 70 vol %, more preferably 30 to 60 vol %.

The LED package of the present invention may be provided with a reflector (not shown) in order to even more efficiently project the light from the LED chip forward. Aside from the use of a separate reflector as the reflector, a conical or dome-shaped depression can be formed in the metal substrate immediately beneath the LED chip assembly so that a reflector is formed by the insulation layer itself. Examples of separate reflectors include those wherein a reflective layer of a metal such as Ag, Al, Ni, Au or Cu, or a metal oxide such as SiOz/ZrO$_2$ or SiO$_2$/TiO$_2$ is formed on the inner surface of a tubular body having an incline of glass, ceramic, metal, resin or the like.

<LED Package Manufacturing Method>

The method of manufacturing an LED package according to the present invention involves the above-indicated steps (i) to (vi). Herebelow, these shall be explained while avoiding duplication of previous explanations where possible.

<LED Package Manufacturing Method—Step (i)>

In this step, an inorganic formed body is produced for infiltration with aluminum or an aluminum alloy, or silicon or a silicon alloy. The inorganic formed body (hereinafter referred to also as a "preform") may be a sintered compact (hereinafter referred to also as an "inorganic porous body") having a porosity of 10 to 50 vol %, or a powder compact having a porosity of 10 to 50 vol %. Some or all of the voids in the preform are impregnated by aluminum or an aluminum alloy, or silicon or a silicon alloy, to form a composite substrate having the above-described properties. The porosity of the preform may be adjusted by adjusting the granularity of the raw material powder, the molding pressure, or heat treatment conditions.

The powder compact of the preform may be composed of the above-mentioned raw material powder alone, or in conjunction with an inorganic binder such as a silica gel or an alumina sol. The molding may be performed by a common ceramic powder forming method such as press forming or cast forming. On the other hand, the inorganic porous body of the preform may be produced, for example, by sintering the above-described powder formed boy. There are no particular restrictions on the shape of the preform, which may be plate-shaped or cylindrical.

<LED Package Manufacturing Method—Step (ii)>

In this step, the preform is impregnated by aluminum or an aluminum alloy using a liquid forging process, or impregnated by silicon or a silicon alloy using a liquid infiltration process, resulting in formation of a composite.

In a liquid forging process, aluminum or an aluminum alloy are heated to at least the melting point, and used to impregnate the preform under pressure. An example of the specific conditions for liquid forging is described in the above-identified patent document, and they may be employed for the present invention, but they can be further described as follows. By liquid forging, it is possible to obtain a composite substrate with high thermal conductivity and excellent heat dissipating ability.

The composition of the aluminum or aluminum alloy used in liquid forging should preferably contain at least 70 mass % of aluminum. Aluminum alloys with an aluminum content of less than 70 mass % may reduce the thermal conductivity of the composite substrate. Examples of aluminum alloys include aluminum-silicon and aluminum-silicon-magnesium. Among these, an aluminum alloy containing 3 to 30 mass % of silicon with a low melting point is preferred in order to allow for good penetration into the voids in the preform. Furthermore, an aluminum-silicon-magnesium alloy containing 3 mass % or less of magnesium is preferred due to the ability to achieve a firm bond between the ceramic and the metal portion. Additionally, regarding the metal components other than aluminum, silicon and magnesium in the aluminum alloy, there are no particular restrictions as long as it is within a range in which there are no extreme changes in the properties, and for example, copper may be included.

The preform is preferably subjected to infiltration after connecting a plurality thereof together to form a stacked body. When connecting a plurality together, mold release plates such as stainless steel plates or ceramic plates coated with a mold release agent should be interposed therebetween, and the preform should be anchored using jigs such as iron or graphite nuts and bolts. The mold release agent may be a spray containing a mold release powder such as graphite, boron nitride or alumina.

The stacked body is preferably heated to a temperature of about 600 to 800° C., then one or more are loaded into a container, an aluminum or aluminum alloy melt heated to at least the melting point is quickly poured in, then the assembly is compressed at a pressure of at least 30 MPa, preferably at least 50 MPa. As a result, the aluminum or aluminum alloy easily impregnates the voids in the preform. If the heating temperature of the stacked body exceeds 800° C., the raw material powder used to mold the preform may be oxidized, thereby reducing the thermal conductivity. Thereafter, the impregnated article may be annealed if needed to remove warping during infiltration.

On the other hand, in the liquid infiltration method, silicon or a silicon alloy and a preform are placed in a crucible of graphite, BN or the like, then the preform is impregnated by the silicon or silicon alloy by means of a non-pressurized infiltration method of subjecting to a heat treatment to at least the melting point of the silicon or silicon alloy in a non-oxidizing atmosphere or under reduced pressure. While powder metallurgy may be used to composite the preform and the silicon or silicon alloy, a non-pressurized infiltration method is preferred in view of the properties. An example of the specific conditions for the liquid infiltration process is described in the patent document above, and they may be employed in the present invention. A liquid infiltration process makes it easier to achieve infiltration of a metal with low melt viscosity such as silicon or a silicon alloy. Examples of silicon alloys for infiltration include silicon alloys containing at least 70 mass % of silicon due to their low melt viscosity enabling them to more easily penetrate into the preform.

<LED Package Manufacturing Method—Step (iii)>

In this step, the composite is worked to form a pre-composite substrate of thickness 0.1 to 2 mm and a surface roughness (Ra) of 0.5 microns or less. As a result, a pre-composite substrate containing 10 to 50 vol % of aluminum or an aluminum alloy, or silicon or a silicon alloy, having a thermal conductivity of 100 to 600 W/(m·K) at a temperature of 25° C., a coefficient of thermal expansion of 3 to $12 \times 10^{-6}$/K from a temperature of 25° C. to 150° C., and a three-point bending strength of 50 to 400 MPa is obtained. The amount of the aluminum or aluminum alloy, or silicon or silicon alloy is adjusted by the porosity of the preform or the infiltration conditions to thereby control the thermal conductivity and the coefficient of thermal expansion. In the present invention, the amount of aluminum or aluminum alloy, or silicon or silicon alloy, in the pre-composite substrate should preferably be 20 to 35 vol %.

The composite is preferably worked in the following manner. When the shape of the composite is cylindrical, it should be externally worked to predetermined dimensions using a diamond grindstone with a cylindrical grinder, then cut to plates of thickness about 0.1 to 0.5 mm by means of a multi-wire saw with fixed abrasive grains, an outside diameter blade, an inside diameter blade, a diamond wire saw or the like, or using a multiwire saw with free abrasive grains. Multiwire saws are suitable for mass production. Subsequently, they are worked to a thickness of 0.1 to 2 mm and a surface roughness (Ra) of 0.5 microns or less using a machine tool such as a two-sided grinder, a rotary grinder, a plane grinder or a lapping machine.

On the other hand, when the composite is plate-shaped, it may be worked to a thickness of 0.1 to 2 mm and a surface roughness (Ra) of 0.5 microns using a machine tool such as a two-sided grinder, a rotary grinder, a plane grinder or a lapping machine.

<LED Package Manufacturing Method—Step (iv)>

In this step, the per-composite substrate is cut to an area that is 2 to 100 times the contact area of the LED chip (i.e., the bottom surface area of the LED chip), to form a composite substrate 2. Then, one or more LED chips 1 are mounted by the bonding material to produce an LED chip assembly 10. The details in this step of cutting to an area of 2 to 100 times and forming a metal layer of at least one metal chosen from among Ni, Co, Pd, Cu, Ag, Au, Pt and Sn as needed have been described above.

The outside diameter processing of the pre-composite substrate may be performed by dicing, laser cutting, water jet cutting and electrical discharge cutting. Dicing is optimal for its processing precision and processing speed, and laser cutting is best in terms of processing speed.

The number of LED chips mounted on the composite substrate is not particularly limited, as long as the area of the composite substrate is in a range of 2 to 100 times the adhesion surface of the LED chips, and the arrangement is such as not to present any problems in mounting or heat dissipation of the individual LED chips. For this reason, it may be an LED chip assembly having two or more LED chips mounted on a single composite substrate. The advantages of mounting a plurality of LED chips is to reduce the number of mounting steps.

<LED Package Manufacturing Method—Step (v)>

In this step, the LED chip assembly 10 is bonded to a circuit board 11 having a metal circuit 3 formed on a metal substrate 5 with an insulation layer 4 in between. This step is described in detail above.

<LED Package Manufacturing Method—Step (vi)>

In this step, the LED chip 1 and the metal circuit 3 are connected by an electrical connection member 9, and at least this LED chip assembly is sealed with a resin encapsulant 8 containing a fluorescent substance to produce the LED package of the present invention. The step is described in detail above.

EXAMPLES

Herebelow, the present invention shall be described in detail by means of embodiments, but the present invention is not to be construed as limited thereto.

Example 1

<Pre-Composite Substrates A and B Using Inorganic Porous Body>

1800 g of silicon carbide powder A (commercial product: average grain size 200 microns), 900 g of silicon carbide powder B (commercial product: average grain size 20 microns), 300 g of silicone carbide powder C (commercial product: average grain size 2 microns) and 150 g of a mold binder (methylcellulose; product of Shin-etsu Chemical; product name "Metolose") were measured out and mixed for 30 minutes in an agitation mixer. The resulting mixture was press-formed at a contact pressure of 10 MPa, then CIP-formed at a pressure of 100 MPa to produce a cylindrical formed body (diameter 55 mm×height 110 mm), which was then subjected to a degreasing treatment for 2 hours in air atmosphere at a temperature of 600° C., then baked for 2 hours in an argon atmosphere at a temperature of 2100° C. The resulting sintered compact was machined in a machining center using a diamond grindstone to external dimensions of diameter 52 mm×height 100 mm to produce an inorganic porous body (porosity 20%). After applying a mold release agent of boron nitride to the resulting inorganic porous body, it was inserted into a graphite jig (exterior dimensions 70 mm×70 mm×100 mm; interior dimensions diameter 52.5 mm×height 100 mm) to form a structure.

Four of the above structures were assembled (140.8 mm×140.8 mm×100 mm) with mold release plates (70 mm×100 mm×0.8 mm) composed of stainless steel plates coated with a graphite mold release material interposed therebetween, then iron plates (thickness 12 mm) were placed on both sides and the entire assembly was connected together with eight bolts to form a single stack. After preheating this stack in an electric furnace at a temperature of 700° C., it was placed in a preheated press mold (interior dimensions 400 mm×300 mm) and after pouring in an aluminum alloy melt (temperature 800° C.) containing 12 mass % silicon and 1 mass % magnesium, it was pressed for 25 minutes at a pressure of 100 MPa for infiltration with the aluminum alloy. After cooling to room temperature, it was sliced along the edges of the mold release plates using a wet bandsaw and the mold release plates were stripped, then the graphite jig portions were removed with a lathe to produce four composites (diameter 52 mm×height 100 mm). These were annealed for 3 hours at a temperature of 530° C. to remove any warping that occurred during infiltration.

A sample for measuring the coefficient of thermal expansion (diameter 3 mm, length 10 mm) and a sample for measuring thermal conductivity (25 mm×25 mm×1 mm) were cut out from the resulting composite by means of grinding, and these were measured for the coefficient of thermal expansion at temperatures of 25° C. to 150° C. using a thermal expansion meter (Seiko TMA300), for thermal conductivity at a temperature of 25° C. by laser flash (Ulvac TC3000), and for three-point bending strength using a bending strength tester. As a result, the coefficient of thermal expansion was $5.0 \times 10^{-6}$/K, the thermal conductivity was 250 W/(m·K) and the strength was 350 MPa.

Next, the composite was subjected to circumferential processing by a diamond grindstone using a cylindrical grinder, resulting in a cylindrical shape of diameter 50.8 mm×height 100 mm, then cut into discs of thickness 0.3 mm using a multiwire saw with diamond abrasive grains at a cutting rate of 0.2 mm/min, and ground to a thickness of 0.22 mm using a double-sided grinder with a #600 diamond grindstone. Thereafter, the discs were polished to a thickness of 0.2 mm using a lapping machine with diamond abrasive grains, then ultrasonically cleaned in pure water followed by isopropyl alcohol, then dried to produce per-composite substrate A. The surface roughness (Ra) was 0.05 microns.

The pre-composite substrate A was subjected to non-electrolytic Ni—P plating and electrolytic Au plating to form a metal layer (5 microns thick) of (4 microns Ni—P+1 micron Au). The surface roughness (Ra) was 0.1 microns. Then, a commercially available UV-curable solder resist layer was applied by screen printing onto one surface of the pre-composite substrate provided with this metal layer, then UV-curing to form resist layers (15 microns) (not shown) at 4 mm intervals resulting in pre-composite substrate B.

<Pre-Composite Substrates a, b Using Inorganic Powder Compact>

352 g of silicon carbide powder A, 176 g of silicon carbide powder B and 59 g of silicon carbide powder C were measured out and mixed for 30 minutes in an agitation mixer. The resulting mixture was loaded into a graphite jig (outer dimensions 70 mm×70 mm×110 mm; inner dimensions diameter 55 mm×height 110 mm), and press-formed at a contact pressure of 10 MPa to produce a powder compact (cylinder of diameter 55 mm×height 110 mm, porosity 30%). Next, aside from the fact that four powder compacts were assembled for each tubular graphite jig produced here instead of assembling four structures as in the production of pre-composite substrate A above, a composite (coefficient of thermal expansion at temperatures of 25° C. to 150° C.: $6.0 \times 10^{-6}$/K; thermal conductivity at temperature of 25° C.: 220 W/(m·K)) was similarly produced, then processed to produce a pre-composite substrate a and a pre-composite substrate b by providing a metal layer and a resist layer (not shown) on the pre-composite substrate a.

<Composite Substrates A, B, a, b>

Subsequently, the resulting pre-composite substrates A, B, a, b were cut to dimensions of 3.9 mm×3.9 mm×0.2 mm using a dicing machine (Disco DAD3350) with a resin bond type diamond blade (R07-SD400) of blade width 0.1 mm at a feeding rate of 8 mm/s, then ultrasonically cleaned in pure water and dried to produce 120 of each type of composite substrate A, B, a, b. The area of the LED chip mounting surface of the resulting composite substrate was 15.2 times the bottom surface area of the LED chip in all cases.

<LED Package>

The LED package shown in FIG. 1 was produced using the component materials below. That is, an insulation layer 4 was deposited to a thickness of 80 microns on the metal substrate 5, then a metal foil was deposited and chemically etched to form a metal circuit 3, then a resist layer 6 was applied to the surface thereof to produce a circuit board 11. On the other hand, an LED chip 1 was adhered to the composite substrate 2. The adhesion was achieved using an Ag paste-type high thermal conductivity adhesive (Kyocera Chemical CT284R) in the composite substrates A, a, and using a cream solder adhesive on the metal layer between the resist layers in the composite substrates B, b. 120 of each type of LED chip assembly 10 were produced. Next, the LED chip assembly was mounted on the circuit board 11 by means of a cream solder or wire bonding by an electrical connection member 9. The area of the mounting surface of the LED chip on the resulting LED chip assembly was 15.2 times the bottom surface area of the LED chip in all cases. Subsequently, a dam material 7 was deposited and filled with a resin encapsulant 8 to produce the LED package of the present invention.

<Component Materials>

LED chip 1: (Cree EZ1000; dimensions 1 mm×1 mm×0.1 mm; output 3 W)

Composite Substrate 2: Composite Substrate A, B, a or b as produced above.

Metal circuit 3: Copper of thickness 35 microns.

Insulation layer 4: Comprising bisphenol A epoxy resin (Japan Epoxy Resin EP-828), phenol novolac (Dainippon Ink Chemical TD-2131) as curing agent and an inorganic filler mixed powder of crushed silica powder of average grain size 1.2 microns (Tatsumori A-1): crushed silica powder of average grain size 10 microns (Tatsumori 5X) at a mass ratio of 7:3, comprising 56 vol % of the insulation layer, and having a thermal conductivity of 2 W/(m·K).
Metal substrate 5: Aluminum of thickness 1.5 mm.
Resist layer 6: (Taiyo Ink PSR4000LEW1)
Dam material 7 Silicone resin (Shin-etsu Chemical KER-2000-DAM).
Resin encapsulant 8: Mixture of 80 mass % silicone resin (Toray Dow Corning JCR6125) and 20 mass % alpha-sialon (with D10 equal to 4.8 microns, D50 equal to 9.1 microns and D90 equal to 18.9 microns).
Electrical connection member 6: Metal wire.

<Evaluation of Heat Dissipating Properties of LED Package>

After removing the resin encapsulant in the central portion of the LED package, an aluminum heat dissipating fin (heat resistance 5.2° C./W, 50 mm×50 mm×17 mm) was attached via a commercially available double-sided adhesive silicone rubber heat dissipating sheet (thermal conductivity 2 W/(m·K)). A voltage was applied to the LED chip with a power output of 3 W, and the temperature of the upper surface of the LED chip was measured by infrared thermography. As a result, the temperatures of the upper surfaces of the LED chips of the LED packages produced using composite substrate A, composite substrate B, composite substrate a and composite substrate b, when averaged across five values, were respectively 69° C., 60° C., 70° C. and 61° C.

Comparative Example 1

In the LED package of Example 1 using composite substrate B, an LED chip was mounted directly onto the circuit board using a cream solder without preparing an LED chip assembly, and the temperature of the upper surface of the LED chip was 105° C.

Examples 2-4 and Comparative Examples 2 and 3

LED packages were prepared in the same manner as in Example 1 using the composite substrate B, aside from changing the cutting width of the multiwire saw to produce composite substrates of different plate thickness, changing the adhesive of the LED chip from a cream solder to a brazing material (Au/Sn=80/20), and setting the LED chip spacing as shown in Table 1, and the upper surface temperatures of the LED chips were measured. The results are shown in Table 1.

Examples 5-7 and Comparative Example 4

LED packages were prepared in the same way as in Example 1 using the composite substrate B, aside from changing the granularity of the diamond abrasive grains during the lapping process to obtain composite substrates of different surface roughness and changing the adhesive of the LED chip from a cream solder to a brazing material (Au/Sn=80/20), and the upper surface temperatures of the LED chips were measured. The results are shown in Table 1.

Examples 8-10 and Comparative Example 5

LED packages were prepared in the same way as in Example 1 using the composite substrate B, aside from changing the adhesive of the LED chip from a cream solder to a brazing material (Au/Sn=80/20) and the spacing when cutting with a dicing machine to prepare composite substrates with different area ratios of the composite substrate with respect to the area of the bottom of the LED chip, and the upper surface temperatures of the LED chips were measured. The results are shown in Table 1.

TABLE 1

| | Plate Thickness (mm) | Area Ratio (factor) | Surface Roughness Ra (microns) | LED Chip Upper Surface Temp. (° C.) |
|---|---|---|---|---|
| Example 2 | 0.1 | 15.2 | 0.05 | 65 |
| Example 3 | 1 | 15.2 | 0.05 | 61 |
| Example 4 | 2 | 15.2 | 0.05 | 63 |
| Example 5 | 0.2 | 15.2 | 0.01 | 59 |
| Example 6 | 0.2 | 15.2 | 0.2 | 61 |
| Example 7 | 0.2 | 15.2 | 0.5 | 65 |
| Example 8 | 0.2 | 2.25 | 0.1 | 71 |
| Example 9 | 0.2 | 25 | 0.1 | 58 |
| Example 10 | 0.2 | 100 | 0.1 | 57 |
| Comparative Example 2 | 0.08 | 15.2 | 0.05 | 90 |
| Comparative Example 3 | 2.3 | 15.2 | 0.05 | 86 |
| Comparative Example 4 | 0.2 | 15.2 | 1.2 | 110 |
| Comparative Example 5 | 0.2 | 1 | 0.1 | 105 |

Examples 11-15

LED packages were prepared in the same way as in Example 1 using the composite substrate B, aside from changing the plating layer (5 microns thick) of (4 microns Ni—P+1 micron Au) to a metal layer of the metal species and metal layer thicknesses shown in Table 2, and the upper surface temperatures of the LED chips were measured. The results are shown in Table 2.

TABLE 2

| | Metal Species | Metal Layer Thickness (microns) | LED Chip Upper Surface Temp. (° C.) |
|---|---|---|---|
| Example 11 | Cu | 5 | 60 |
| Example 12 | Pt | 2 | 60 |
| Example 13 | Co + Au | 3 + 1 | 61 |
| Example 14 | Sn + Au | 3 + 1 | 61 |
| Example 15 | Ag + Au | 3 + 1 | 63 |

Example 16

<LED Chip Assembly and LED Package with Composite Substrates C, D Using Inorganic Porous Body>

1300 g of silicon carbide powder D (commercial product: average grain size 150 microns), 700 g of silicon carbide powder E (commercial product: average grain size 10 microns) and 300 g of a silic sol (Nissan Chemical Snowtex) were measured out and mixed for 30 minutes in an agitation mixer, then press-formed at a contact pressure of 30 MPa into the shape of a plate of dimensions 160 mm×160 mm×5 mm to form a formed body. The resulting formed body was dried for 1 hour at a temperature of 120° C., baked for 2 hours at a temperature of 1400° C. in a nitrogen atmosphere to produce a sintered compact of porosity 35%, which was then machined in a machining center using a diamond grindstone to external dimensions of 155 mm×155 mm×3 mm to produce an inorganic porous body.

Ten inorganic porous bodies were arranged with a mold release plate (160 mm×160 mm×0.8 mm) coated with a graphite mold release agent interposed between each to form a structure (170 mm×170 mm×40 mm), and iron plates were positioned on both sides (plate thickness 12 mm), then connected with eight bolts to form a single stacked body. Thereafter, a composite body (155 mm×155 mm×3 mm) was formed in the same manner as composite substrate A in Example 1, and upon measuring the coefficient of thermal expansion at temperatures of 25° C. to 150° C., the thermal conductivity at a temperature of 25° C. and the three-point bending strength, they were respectively $7.5 \times 10^{-6}$/K, 200 W/(m·K) and 400 MPa.

The resulting composites were worked to plates of thickness 0.4 mm using a planar grinder with a diamond grindstone, then cut to dimensions of diameter 50.8 mm×0.4 mm using a waterjet cutter (Sugino Machines Abrasive Jet Cutter NC) with garnet of granularity 100 microns as the abrasive grains for grinding under a pressure of 250 MPa and a cutting rate of 100 mm/min. Thereafter, they were ground to a thickness of 0.3 mm using a double-sided grinder with a #800 diamond grindstone, ultrasonically cleaned in pure water followed by isopropyl alcohol, then dried to produce a pre-composite substrate C. The surface roughness (Ra) was 0.1 microns. Additionally, a metal layer similar to that of the above pre-composite substrate B was formed to prepare pre-composite substrate D, then the pre-composite substrates C and D were cut by the same method as composite substrate A of Example 1 to produce composite substrates C and D.

Upon measuring the temperature of the upper surface of the LED chip of an

LED package produced using the composite substrate C and measuring the temperature of the upper surface of the LED chip of an LED package produced using the composite substrate D in the same manner as above, they were found to be 70° C. and 62° C.

Example 17

<LED Chip Assembly and LED Package with Composite Substrates E and F Using Inorganic Porous Bodies>

A composite was formed in the same manner as the production of composite substrate A, aside from the use of an isotropic graphite formed body (Tokai Carbon G458, porosity 13 vol %, dimensions 100 mm×100 mm×100 mm) as the inorganic porous body, and the use of a stainless steel plate (100 mm×100 mm×0.8 mm) coated with a graphite mold release material as the mold release plate.

This composite was cut with a diamond saw, then the outer circumference was machined to a cylindrical shape of diameter 50.8 mm×100 mm using a cylindrical grinder with a diamond grindstone, and this was further cut into discs of thickness 0.4 mm at a cutting rate of 0.5 mm/min. The resulting discs were ground to a thickness of 0.3 mm using a double-sided grinder with a #600 diamond grindstone, ultrasonically cleaned in water followed by isopropyl alcohol and dried to form a pre-composite substrate E. The surface roughness (Ra) was 0.15 microns. Additionally, a metal layer similar to the pre-composite substrate B was formed on the pre-composite substrate E to form pre-composite substrate F, then the resulting pre-composite substrates E and F were cut to dimensions of 3.9 mm×3.9 mm using an electrical discharge cutter at a cutting speed of 0.5 mm/s to produce composite substrates E and F.

After bonding an LED chip (Cree Z1000; 1 mm×1 mm×0.1 mm) of output 3 W to composite substrates E and F, the upper surface temperature of the LED chip in the LED package produced using composite substrate E and the upper surface temperature of the LED chip in the LED package produced using composite substrate F were measured and found to be respectively 72° C. and 66° C.

Example 18

A mixed powder comprising 2880 g of aluminum nitride powder (commercial product: average grain size 2 microns), 120 g of an yttrium powder (commercial product: average grain size 1 micron), 150 g of a molding binder (methylcellulose) and 150 g of pure water was press-formed with a contact pressure of 10 MPa, then further CIP formed at a molding pressure of 100 MPa to produce a cylindrical body (diameter 55 mm×110 mm). This was degreased for 2 hours at a temperature of 600° C. in air atmosphere, then baked for 4 hours at a temperature of 1780° C. in a nitrogen atmosphere to produce a sintered compact, which was then machined in a machining center using a diamond grindstone to produce an inorganic porous body (diameter 52 mm×100 mm) with a porosity of 22%.

A pre-composite substrate G (diameter 50.8 mm×0.2 mm) was produced in the same manner as the composite substrate A in Example 1, aside from using an inorganic porous body and using pure aluminum instead of an aluminum alloy. The surface roughness (Ra) was 0.06 microns. Additionally, a metal layer similar to that of the above-described pre-composite substrate B was formed on pre-composite substrate G to form pre-composite substrate H, then the resulting pre-composite substrates G and H were cut to dimensions of 3.9 mm×3.9 mm at a cutting rate of 8 mm/s using a laser cutter to produce composite substrates G and H.

Four LED chips (Cree EZ700; 0.7 mm×0.7 mm×0.1 mm) of output 1 W, spaced at intervals of 2 mm, were bonded to the composite substrates G and H by means of a cream solder adhesive material to produce an LED chip assembly. The resulting LED chip assembly had a structure having four LED chips mounted on the upper surface of a single composite substrate, and the areas of the mounting surfaces of the LED chips on the composite substrate were 7.8 times the total area of the bottoms of the LED chips. Voltages were applied to the LED chips so as to obtain an output of 4 W, then the temperature on the upper surface of the LED chip was measured by infrared thermography. As a result, the upper surface temperature of the LED package produced using composite substrate G was 70, and that produced using a composite substrate H was 63° C.

Example 19

<LED Chip Assembly and LED Package with Composite Substrates I, J Using Inorganic Porous Bodies>

A cylindrical body (diameter 55 mm×110 m) was produced in the same manner as Example 18 aside from using a mixture comprising 2790 g of a silicon carbide powder (commercial product: average grain size 1 micron), 150 g of an yttrium powder (commercial product: average grain size 1 micron) and 60 g of a magnesium oxide powder (commercial product: average grain size 1 micron). This was baked for 4 hours at a temperature of 1880° C. in a nitrogen pressurized atmosphere of 0.9 MPa to produce a sintered compact, which was then machined using a machining center with a diamond grindstone to produce an inorganic porous body (diameter 52 mm×100 mm) with a porosity of 13%. As a result, the surface roughness (Ra) of the composite substrate I was 0.05 microns. Additionally, the upper surface temperature of the LED chip of the LED package produced using the composite substrate I was 72° C., and that produced using the composite substrate J was 66° C.

Example 20

<LED Chip Assembly and LED Package with Composite Substrates c, d Using Inorganic Powder Compacts>

After mixing 7 g of a diamond powder A (Diamond Innovations MBG-600; average grain size 120 microns) and 3 g of a diamond powder B (Diamond Innovations MBG-600; average grain size 15 microns) for 10 minutes in an alumina mortar, a graphite jig Y of outer dimensions of diameter 52.4 mm×9 mm was inserted in a graphite jig X of outer dimensions 70 mm×70 mm×20 mm (inner dimensions of diameter 52.5 mm×20 mm), then filled with 10 g of the mixed diamond powder, after which a graphite jig Y was further inserted onto the upper surface of the mixed diamond powder to form an inorganic powder compact of porosity 35%.

This inorganic powder compact was formed into a stack in accordance with the production of composite substrate a above, and subjected to an infiltration treatment to produce a composite (70 mm×70 mm×20 mm) enclosed by a graphite jig. This was ground from both main surfaces using a planar grinder with a diamond grindstone until the composite was exposed (70 mm×70 mm), resulting in a plate-shaped body (70 mm×70 mm×1 mm). Then, the circumference was machined into the shape of a disc (diameter 50.8 mm×1 mm) using a waterjet cutter to form a composite substrate c. The surface roughness (Ra) was 0.4 microns. Additionally, a plating layer and resist layer were formed in the same manner as composite substrate b to produce a composite substrate d. As a result, the thermal conductivity of the composite substrate c at a temperature of 25° C. was 500 W/(m·K).

Additionally, the upper surface temperature of the LED chip of an LED package produced using composite substrate c was 66° C. and that produced using composite substrate d was 58° C.

Example 21

<LED Chip Assembly and LED Package with Composite Substrates K, L Using Inorganic Porous Body>

An inorganic porous body (outer dimensions of diameter 52 mm×height 100 mm; porosity 20%) produced by the production method of composite substrate A in Example 1 was machined into a disc with outer dimensions of diameter 52 mm×20 mm using a machining center with a diamond grindstone. This disc and a piece of silicon were placed in a graphite crucible coated with BN powder, and set inside an electric furnace. The furnace was evacuated and held at 1650° C. for 8 hours to impregnate the disc with silicon. After cooling to room temperature, the extraneous silicon was removed with a cylindrical grinder to produce a composite, and upon measuring the coefficient of thermal expansion at temperatures of 25° C. to 150° C. and the thermal conductivity at a temperature of 25° C. in the same manner as Example 1, the coefficient of thermal expansion was $43 \times 10^{-6}$/K and the thermal conductivity was 210 W/(m·K).

Thereafter, a composite substrate K was produced by the same process as composite substrate A and a composite substrate L was produced by the same process as composite substrate B. As a result, the surface roughness (Ra) of the composite substrate K was 0.08 microns. Additionally, the upper surface temperature of the LED chip of an LED package produced using composite substrate K was 69° C. and that produced using the composite substrate L was 61° C.

Example 22 Comparative Example 6

<LED Chip Assembly and LED Package with Composite Substrates e, f Using Inorganic Powder Compact>

461 g of silicon carbide powder E (commercial product: average grain size 10 microns) (Example 22) and 377 g of silicon carbide powder F (commercial product: average grain size 6 microns) (Comparative Example 6) were loaded into a graphite jig (outer dimensions 70 mm×70 mm×110 mm; inner dimensions of diameter 55 mm height 110 mm), then press-formed at a contact pressure of 5 MPa to produce powder compacts (cylindrical bodies of diameter 55 mm×height 110 mm) with a porosity of 45% (Example 22) or a porosity of 55% (Comparative Example 6). Aside from the use thereof, a composite substrate e (Example 22) and a composite substrate f (Comparative Example 6) were produced in the same manner as composite substrate b of Example 1, and this was followed by production of an LED chip assembly and an LED package, for which the upper surface temperature of the LED chip was measured. The results are shown in Table 3. Additionally, the coefficient of thermal expansion at temperatures of 25° C. to 150° C., the thermal conductivity at a temperature of 25° C. and the three-point bending strength were measured in the same manner as Example 1, whereupon the composite substrate e was found to have a coefficient of thermal expansion of $10.5 \times 10^{-6}$/K, a thermal conductivity of 120 W/(m·K), and a strength of 500 MPa, and the composite substrate f was found to have a coefficient of thermal expansion of $12.5 \times 10^{-6}$/K, a thermal conductivity of 80 W/(m·K) and a strength of 550 MPa.

Examples 23 and 24

<LED Chip Assembly and LED Package with Composite Substrates h, g Using Inorganic Powder Composite>

Aside from using an aluminum alloy containing 3 mass % of silicon (Example 23) or an aluminum alloy containing 20 mass % of silicon (Example 24) instead of an aluminum alloy containing 12 mass % of silicon and 1 mass % of magnesium, and using an aluminum (Al) circuit (thickness 35 microns) instead of a copper (Cu) circuit (thickness 35 microns), a composite substrate g and a composite substrate h were produced in the same manner as in the case of composite substrate b of Example 1, after which LED chip assemblies were produced and LED packages were produced, and the upper surface temperatures of the LED chips were measured. The results are shown in Table 3. Additionally, upon measuring the coefficient of thermal expansion at a temperature of 25° C. to 150° C. and the thermal conductivity at a temperature of 25° C. in the same manner as Example 1, the composite substrate g had a coefficient of thermal expansion of $5.8 \times 10^{-6}$/K and a thermal conductivity of 215 W/(m·K), and the composite substrate h had a coefficient of thermal expansion of $6.3 \times 10^{-6}$/K and a thermal conductivity of 230 W/(m·K).

TABLE 3

|  | Porosity of Powder Compact (%) | Aluminum Alloy | LED Chip Upper Surface Temp. (° C.) |
|---|---|---|---|
| Example 22 | 45 | 87Al—12Si—1Mg | 68 |
| Example 23 | 30 | 97Al—3Si | 63 |
| Example 24 | 30 | 80Al—20Si | 64 |
| Comparative Example 6 | 35 | 87Al—12Si—1Mg | 80 |

Examples 25 and 26

<LED Chip Assembly and LED Package with Composite Substrates i, j Using Inorganic Powder Compact>

Aside from using a beta-sialon powder (Example 25) or a CASIN powder (Example 26) instead of an alpha-sialon powder, composite substrate i (Example 25) and composite substrate j (Example 26) were produced in the same manner as composite substrate b of Example 1, after which LED chip assemblies were produced and LED packages were produced. Upon measuring the upper surface temperatures of the LED chips, they both yielded good results roughly equivalent to the LED package produced using the composite substrate b according to Example 1.

Finally, the main conditions and results of the Examples and Comparative Examples are summarized in Tables 4-6.

TABLE 4

| | Inorganic Formed Body | | | | | Composite Substrate | | | | | |
|---|---|---|---|---|---|---|---|---|---|---|---|
| | Type | Por (%) | Imp Met | Met Lyr | Res Lyr | Thick w/o Met/Res (mm) | Surf Rough Ra (μm) | Therm Cond (W/(m·K)) | Coeff Therm Exp (×10⁻⁶/K) | 3-pt. Bend Str (MPa) | Code |
| Ex 1 | SiC porous body | 20 | 12% Si—1% Mg—Al | none | n | 0.2 | 0.1 | 250 | 5.0 | 350 | A |
| | | | | Ni—P + Au | y | | | 250 | 5.0 | 350 | B |
| | SiC powder compact | 30 | | none | n | | | 220 | 6.0 | 400 | a |
| | | | | Ni—P + Au | y | | | 220 | 6.0 | 400 | b |
| Ex 2 | SiC porous body | 20 | | Ni—P + Au | y | 0.1 | 0.05 | 250 | 5.0 | 350 | — |
| Ex 3 | | | | | | 1 | 0.05 | | | | |
| Ex 4 | | | | | | 2 | 0.05 | | | | |
| Ex 5 | | | | | | 0.2 | 0.01 | | | | |
| Ex 6 | | | | | | | 0.2 | | | | |
| Ex 7 | | | | | | | 0.5 | | | | |
| Ex 8 | | | | | | | 0.1 | | | | |
| Ex 9 | | | | | | | | | | | |
| Ex 10 | | | | | | | | | | | |
| Ex 11 | | | | Cu | | | | | | | |
| Ex 12 | | | | Pt | | | | | | | |
| Ex 13 | | | | Co + Au | | | | | | | |
| Ex 14 | | | | Sn + Au | | | | | | | |
| Ex 15 | | | | Ag + Au | | | | | | | |

| | | Inorganic Formed Body | | LED Out (W) | LED Chip Assembly Area Ratio | | Bond Mat | LED Package | | | LED Chip Surf Temp (°C) |
|---|---|---|---|---|---|---|---|---|---|---|---|
| | | Type | Por (%) | | No. LED | Sub/LED Cont Area | | Met Cir | Met Sub | Fluo Sub | |
| | Ex 1 | SiC porous body | 20 | 3 | 1 | 15.2 | Ag paste cream solder | Cu circuit (35 μm) | Al plate (1.5 mm) | α-sialon | 69 |
| | | | | | | | | | | | 60 |
| | | SiC powder compact | 30 | | | | Ag paste cream solder | | | | 70 |
| | | | | | | | | | | | 61 |
| | Ex 2 | SiC porous body | 20 | | | | braz mat (Au/Sn) | | | | 65 |
| | Ex 3 | | | | | | | | | | 61 |
| | Ex 4 | | | | | | | | | | 63 |
| | Ex 5 | | | | | | | | | | 59 |
| | Ex 6 | | | | | | | | | | 61 |
| | Ex 7 | | | | | | | | | | 65 |
| | Ex 8 | | | | | | 2.3 | | | | | 71 |
| | Ex 9 | | | | | | 25 | | | | | 58 |
| | Ex 10 | | | | | | 100 | | | | | 57 |
| | Ex 11 | | | | | | 15.2 | cream solder | | | | 60 |
| | Ex 12 | | | | | | | | | | | 60 |
| | Ex 13 | | | | | | | | | | | 61 |
| | Ex 14 | | | | | | | | | | | 61 |
| | Ex 15 | | | | | | | | | | | 63 |

TABLE 5

| | Inorganic Formed Body | | | Composite Substrate | | | | | | | |
|---|---|---|---|---|---|---|---|---|---|---|---|
| | Type | Por (%) | Imp Met | Met Lyr | Res Lyr | Thick w/o Met/Res (mm) | Surf Rough Ra (μm) | Therm Cond (W/(m·K)) | Coeff Therm Exp (×10⁻⁶/K) | 3-pt. Bend Str (MPa) | Code |
| Ex 16 | SiC porous body | 35 | 12% Si—1% Mg—Al | none<br>Ni—P + Au | n<br>n | 0.2 | 0.1 | 200 | 7.5 | 400 | C<br>D |
| Ex 17 | graphite porous body | 13 | | none<br>Ni—P + Au | n<br>n | | 0.05 | 200 | 4.8 | 55 | E<br>F |
| Ex 18 | AlN porous body | 22 | Al | none<br>Ni—P + Au | n<br>n | | 0.06 | 150 | 5.8 | 350 | G<br>H |
| Ex 19 | SN porous body | 13 | | none<br>Ni—P + Au | n<br>n | | 0.05 | 100 | 3.8 | 550 | I<br>J |
| Ex 20 | diamond powder compact | 35 | 12% Si—1% Mg—Al | none<br>Ni—P + Au | n<br>y | | 0.4 | 500 | 6.5 | 300 | c<br>d |
| Ex 21 | SiC porous body | 20 | Si | none<br>Ni—P + Au | n<br>y | | 0.08 | 210 | 4.3 | 350 | K<br>L |

| | | Inorganic Formed Body | | LED Out (W) | LED Chip Assembly | | | LED Package | | | LED Chip |
|---|---|---|---|---|---|---|---|---|---|---|---|
| | | Type | Por (%) | | No. LED | Area Ratio (Comp Sub/LED Cont Area) | Bond Mat | Met Cir | Met Sub | Fluo Sub | Surf Temp (°C.) |
| | Ex 16 | SiC porous body | 35 | 3 | 1 | 15.2 | Ag paste cream solder | Cu circuit (35 μm) | Al plate (1.5 mm) | α-sialon | 70<br>62 |
| | Ex 17 | graphite porous body | 13 | 3 | 1 | 15.2 | Ag paste cream solder | | | | 72<br>66 |
| | Ex 18 | AlN porous body | 22 | 1 | 4 | 7.8 | Ag paste cream solder | | | | 70<br>63 |
| | Ex 19 | SN porous body | 13 | 1 | 4 | 7.8 | Ag paste cream solder | | | | 72<br>66 |
| | Ex 20 | diamond powder compact | 35 | 3 | 1 | 15.2 | Ag paste cream solder | | | | 66<br>58 |
| | Ex 21 | SiC porous body | 20 | 3 | 1 | 15.2 | Ag paste cream solder | | | | 69<br>61 |

TABLE 6

| | Inorganic Formed Body | | | Composite Substrate | | | | | | | |
|---|---|---|---|---|---|---|---|---|---|---|---|
| | Type | Por (%) | Imp Met | Met Lyr | Res Lyr | Thick w/o Met/Res (mm) | Surf Rough Ra (μm) | Therm Cond (W/(m·K)) | Coeff Therm Exp (×10⁻⁶/K) | 3-pt. Bend Str (MPa) | Code |
| Ex 22 | SiC powder compact | 45 | 12% Si—1% Mg—Al | Ni—P + Au | y | 0.2 | 0.06 | 120 | 10.5 | 500 | e |
| Ex 23 | SiC powder compact | 30 | 3% Si—Al | | | | 0.08 | 215 | 5.8 | 400 | g |
| Ex 24 | | | 20% Si—Al | | | | 0.08 | 230 | 6.3 | 400 | h |
| Ex 25 | | | 12% Si—1% Mg—Al | | | | 0.1 | 220 | 6.0 | 400 | i |

TABLE 6-continued

| | Type | Por(%) | | | | | | | | |
|---|---|---|---|---|---|---|---|---|---|---|
| Ex 26 | | | | | | 0.1 | 220 | 6.0 | 400 | j |
| Co Ex 1 | | | | | not produced | | | | | |
| Co Ex 2 | SiC porous body | 20 | 12% Si—1% Mg—Al | Ni—P+Au | y | 0.08 | 0.05 | 250 | 5.0 | 350 | — |
| Co Ex 3 | | | | | | 2.3 | 0.05 | | | | |
| Co Ex 4 | | | | | | 0.2 | 1.2 | | | | |
| Co Ex 5 | | | | | | 0.2 | 0.1 | | | | |
| Co Ex 6 | SiC powder compact | 55 | | | | 0.2 | 0.1 | 80 | 12.5 | 550 | f |

| | Inorganic Formed Body | | LED | | Area Ratio (Comp Sub/LED Cont Area) | Bond Mat | LED Package | | | LED Chip Surf Temp (°C.) |
|---|---|---|---|---|---|---|---|---|---|---|
| | Type | Por (%) | Out (W) | No. LED | | | Met Cir | Met Sub | Fluo Sub | |
| Ex 22 | SiC powder compact | 45 | 3 | 1 | 15.2 | cream solder | Cu circuit 35 μm | Al plate 1.5 mm | α-sialon | 68 |
| Ex 23 | SiC powder compact | 30 | | | | | Al circuit 35 μm | | | 63 |
| Ex 24 | | | | | | | Al circuit 35 μm | | | 64 |
| Ex 25 | | | | | | | Cu circuit 35 μm | | β-sialon | 62 |
| Ex 26 | | | | | | | | | CASIN | 62 |
| Co Ex 1 | | | not produced | | | cream solder | Cu circuit 35 μm | Al plate 1.5 mm | α-sialon | 105 |
| Co Ex 2 | SiC porous body | 20 | 3 | 1 | 15.2 | braz mat (Au/Sn) | | | | 90 |
| Co Ex 3 | | | | | | | | | | 86 |
| Co Ex 4 | | | | | | | | | | 110 |
| Co Ex 5 | | | | | 1 | | | | | 105 |
| Co Ex 6 | SiC powder compact | 55 | | | 15.2 | cream solder | | | | 80 |

The invention claimed is:

1. An LED chip assembly, comprising:
   an LED chip;
   a composite substrate; and
   a bonding material,
   wherein
   the LED chip is directly mounted on the substrate with the bonding material,
   the substrate is obtained by a process comprising infiltrating an inorganic formed body with at least one selected from the group consisting of aluminum and silicon,
   the substrate has a thickness of 0.1 to 2 mm, a surface roughness (Ra) of 0.5 microns or less, a thermal conductivity of 100 to 600 W/(m·k) at a temperature of 25° C., a coefficient of thermal expansion of 3 to $12\times10^{-6}$/K at a temperature in a range of 25° C. to 150° C., and a three-point bending strength of 50 to 500 MPa, and
   an area of an LED chip-mounting surface on the composite substrate is 2 to 100 times an area of contact with the LED chip.

2. An LED chip assembly, comprising:
   an LED chip;
   a composite substrate; and
   a bonding material,
   wherein
   the LED chip is directly mounted on the substrate with the bonding material,
   the substrate is obtained by a process comprising infiltrating an inorganic formed body having a porosity of 10 to 40 vol % with an aluminum-silicon alloy having an aluminum content of 80 to 97 mass %,
   the substrate has a thickness of 0.1 to 1 mm, a surface roughness (Ra) of 0.05 to 0.5 microns, a thermal conductivity of 100 to 300 W/(m·k) at a temperature of 25° C., a coefficient of thermal expansion of 4 to $9\times10^{-6}$/K at a temperature in a range of 25° C. to 150° C., and a three-point bending strength of 50 to 400 MPa, and
   an area of an LED chip-mounting surface on the composite substrate is 2 to 25 times an area of contact with the LED chip.

3. The LED chip assembly of claim 1, wherein the composite substrate comprises, on its surface, a metal layer comprising at least one metal selected from the group consisting of Ni, Co, Pd, Cu, Ag, Au, Pt, and Sn, having a thickness in a range of 0.5 to 20 microns.

4. The assembly of claim 1, wherein the bonding material is bonded to the LED chip and the substrate by soldering, brazing, or adhesion by a high thermal conductivity adhesive.

5. The assembly of claim 1, wherein the inorganic formed body comprises at least one selected from the group consisting of silicon carbide, aluminum nitride, silicon nitride, diamond, and graphite.

6. The assembly of claim 1, wherein the LED chip is a non-insulated structure having an output of at least 0.5 W.

7. An LED package, comprising:
   the LED chip assembly of claim 1; and
   a circuit board comprising a metal circuit formed on a metal substrate with an insulation layer in between the circuit and the substrate,
   wherein an LED chip of the assembly is connected to the metal circuit of the circuit board by an electrical connection member, and at least the LED chip assembly and the electrical connection member are sealed by a resin encapsulant comprising a fluorescent substance.

8. The LED package of claim 7, wherein the fluorescent substance is at least one selected from the group consisting of alpha-sialon, beta-sialon, CASIN (Ca.Al.Si.N$_3$), yttrium-aluminum-garnet, and a sulfide, and the resin encapsulant comprises a filler other than the fluorescent substance, having a relative refractive index of at least 2.2, and an average grain size of 1 to 100 nm.

9. The LED package of claim 7, wherein the insulation layer has a thermal conductivity of 0.5 to 20 W/(m·K) and a thickness of 0.03 to 0.2 mm, and the metal circuit is aluminum or copper and has a thickness is 0.005 to 0.4 mm.

10. A method of manufacturing the LED package of claim 7, the method comprising:
   (i) molding a sintered compact or a powder compact having a porosity of 10 to 50 vol % and comprising at least one selected from the group consisting of silicon carbide, aluminum nitride, silicon nitride, diamond, and graphite, to obtain an inorganic formed body;
   (ii) impregnating the inorganic formed body with aluminum or an aluminum alloy by liquid forging at a pressure of at least 30 MPa, or impregnating with silicon or a silicon alloy by liquid infiltration, to obtain a composite;
   (iii) machining the composite, to produce a pre-composite substrate having a thickness of 0.1 to 2 mm, a surface roughness (Ra) of 0.5 microns or less, a thermal conductivity of 100 to 600 W/(m·K) at a temperature of 25° C., a coefficient of thermal expansion of 3 to $12\times10^{-6}$/K at a temperature in a range of 25° C. to 150° C., and a three-point bending strength of 50 to 400 MPa;
   (iv) depositing a metal layer comprising at least one metal selected from the group consisting of Ni, Co, Pd, Cu, Ag, Au, Pt, and Sn on the pre-composite substrate to obtain a composite substrate, then cutting the substrate to an area of 2 to 100 times a contact area of an LED chip to be mounted, and subsequently mounting an LED chip with a bonding material to the substrate, to obtain an LED assembly;
   (v) bonding the assembly to a circuit board comprising a metal circuit formed on a metal substrate with an insulation layer between the metal circuit and the metal substrate; and
   (vi) connecting the LED chip of the LED chip assembly to the metal circuit of the circuit board with an electrical connection member, then sealing at least the LED chip assembly and the electrical connection member with a resin encapsulant comprising a fluorescent substance.

11. The assembly of claim 1, wherein the inorganic formed body has a porosity of 20-35 vol %.

12. The assembly of claim 3, wherein the metal layer has a thickness of 2 to 20 microns.

13. The assembly of claim 12, wherein the metal layer comprises Ni.

14. The assembly of claim 12, wherein the metal layer comprises Au.

15. The assembly of claim 12, wherein the metal layer comprises Ni and Au.

16. The assembly of claim 5, wherein the inorganic formed body comprises silicon carbide.

17. The LED package of claim 8, wherein the fluorescent substance is alpha-sialon.

18. The LED package of claim 8, wherein the filler comprises at least one selected from the group consisting of a ceramic oxide, a ceramic nitride, an a ceramic carbide.

* * * * *